United States Patent
Steffen

(12)
(10) Patent No.: US 6,259,022 B1
(45) Date of Patent: *Jul. 10, 2001

(54) CHIP CARD MICROMODULE AS A SURFACE-MOUNT DEVICE

(75) Inventor: Francis Steffen, Saint Maxim (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/174,755

(22) Filed: Oct. 19, 1998

Related U.S. Application Data

(63) Continuation of application No. 08/655,197, filed on May 28, 1996, now Pat. No. 5,917,706.

(30) Foreign Application Priority Data

May 29, 1995 (FR) .................................................. 95 06328

(51) Int. Cl.$^7$ ................................................ H01L 23/043
(52) U.S. Cl. .................. 174/52.2; 174/52.1; 361/760; 361/783; 361/773; 257/668; 257/679; 257/693; 257/695; 257/696; 257/735
(58) Field of Search .................. 174/52.1, 52.4, 174/52.2; 235/488, 492; 257/679, 787, 678, 735, 693, 695, 696, 668; 361/737, 820, 760, 783, 772–774; 439/68; 902/25, 26

(56) References Cited

U.S. PATENT DOCUMENTS

| 4,017,889 | 4/1977 | Miller . |
| 4,990,759 | 2/1991 | Gloton et al. .................. 235/492 |
| 5,001,829 | 3/1991 | Schelhorn ........................ 29/840 |

(List continued on next page.)

FOREIGN PATENT DOCUMENTS

| 35 36 431 | 4/1987 | (DE) . |
| 0 408 904 | 1/1991 | (EP) . |
| 0 498 446 | 8/1992 | (EP) . |
| 0 623 956 | 11/1994 | (EP) . |
| 0 624 053 | 11/1994 | (EP) . |
| 2 487 580 | 7/1980 | (FR) . |
| 2 115 607 | 9/1983 | (GB) . |
| 2 249 746 | 5/1992 | (GB) . |

OTHER PUBLICATIONS

French Search Report from French Patent Application No. 95 06328, filed May 29, 1995.
IBM Technical Disclosure Bulletin, vol. 36, No. 10, Oct. 1993, New York US, pp. 481–483, "Ball Limiting Annulus Structure For C4 Bump Formation".
French Search Report from French Patent Application 95 13487, dated Jul. 16, 1996.
IBM Technical Disclosure Bulletin "Microelectronic Device Standoffs" by L.F. Miller vol. 8, No. 3, pp. 380.
IBM Technical Disclosure Bulletin "Semiconductor Module Structure" by Ainslie et al. vol. 14, No. 1, pp. 246.
IBM Technical Disclosure Bulletin "Thermal Stress Resistant Solder Reflow Chip Joints" by Hamilton et al. vol. 14, No. 1, pp. 257 and 258.

*Primary Examiner*—Jeffrey Gaffin
*Assistant Examiner*—John B. Vigushin
(74) *Attorney, Agent, or Firm*—Wolf, Greenfield & Sacks, P.C.; James H. Morris; Theodore E. Galanthay

(57) ABSTRACT

A micromodule is used as a surface-mounted package on a substrate of interconnections. In one embodiment of the invention, barriers to the expansion of solder are formed between contact zones of the micromodule and corresponding contact pads of the substrate. A mechanical stopping device is planned to keep the thickness of the interface of solder. In another embodiment of the invention, contact zones are extended by tongues. A cambering operation enables the formation of the surface-mounting pins.

6 Claims, 3 Drawing Sheets

U.S. PATENT DOCUMENTS

| | | |
|---|---|---|
| 5,041,395 | 8/1991 | Steffen . |
| 5,075,759 * | 12/1991 | Moline ................................. 257/723 |
| 5,079,673 * | 1/1992 | Kodai et al. ......................... 361/783 |
| 5,097,117 * | 3/1992 | Champagne et al. ................ 235/488 |
| 5,147,982 * | 9/1992 | Steffen ............................... 174/52.2 |
| 5,216,278 | 6/1993 | Lin et al. ............................. 257/688 |
| 5,309,021 | 5/1994 | Shimamoto et al. ................ 257/666 |
| 5,325,072 | 6/1994 | Kohjiro et al. ...................... 257/728 |
| 5,477,086 | 12/1995 | Rostoker et al. .................... 257/692 |
| 5,477,419 | 12/1995 | Goodman et al. ................... 361/760 |
| 5,559,372 | 9/1996 | Kwon .................................. 257/692 |
| 5,569,879 * | 10/1996 | Gloton et al. ........................ 174/52.2 |
| 5,585,669 | 12/1996 | Venambre ............................ 257/679 |
| 5,631,809 | 5/1997 | Takagi et al. ........................ 257/728 |
| 5,640,306 | 6/1997 | Gaumet et al. ...................... 361/728 |
| 5,917,706 * | 6/1999 | Steffen ................................. 361/773 |

* cited by examiner

CHIP CARD MICROMODULE AS A SURFACE-MOUNT DEVICE

CROSS REFERENCE TO RELATED APPLICATIONS

This application is a continuation of application Ser. No. 08/665,197, filed May 28, 1996, now U.S. Pat. No. 5,917, 706, entitled CHIP CARD MICROMODULE AS A SURFACE-MOUNT DEVICE, which prior application is incorporated herein by reference.

BACKGROUND OF THE INVENTION

1. Field of the Invention

The present invention relates to the use of an integrated circuit micromodule as a surface-mounted package on a substrate of interconnections.

Surface-mounting combines a set of operations for the placing of miniature components on the surface of a printed circuit or a silk-screen printed substrate of a hybrid circuit.

The components are placed by automatic positioning machines on the substrate and then soldered. They are not provided with outgoing wires and do not require holes in the circuit in order to be attached. Their packaging is done in alveolar strips or in tubes. They are drawn out by suction in order to be then transferred to the substrate.

The term "micromodule" refers to the miniature unit formed chiefly by one or more integrated circuit chips and a connector formed by fine and substantially plane contact zones, this miniature unit being designed to be inserted into a thin information carrier of the chip card or memory-based key type so that the connector is flush with the surface of the information carrier, the chip being embedded in the carrier. The connector has six to eight contact zones distributed in two rows that provide for five to eight standardized ports or points of access to the chip: the electrical ground GND, the logic supply VCC, the programming voltage VPP (not always used), zero reset RST, clock CLK and series data input/output I/O, two other zones being available for specific or future applications (8-contact connector). International standards define the various characteristics of the micromodules (ISO 7810 to 7816). One of these characteristics is their small thickness. Indeed, a micromodule typically has a thickness of less than 0.6 millimeters.

2. Discussion of the Related Art

Various industrial methods for the manufacture of micromodules have been developed. A first known method consists chiefly in attaching a chip to a metal strip that bears the contact zones which are mechanically partitioned. The chip is connected by wires soldered to the different contact zones. The chip and the wires are then coated with a drop of protective resin. A strip of micromodules in series is obtained. A partitioning operation then gives the individual micromodules which will then be fitted into cards.

To resolve the problems of adhesion of the resin on the metallized gate and of the overflow of resin on the contact zones of the connector, it is preferred to use molded dielectric or dielectric transferred under heat to the grid so as to form a single-face metallized carrier on which the chip is mounted on the dielectric side and connected by wires going through perforations of the dielectric and soldered to the contact zones.

Another known method for making a single-face metallized carrier for micromodules uses a perforated dielectric strip, on one face of which metal is laminated. The metal is then etched to form the contact zones of the connector.

Other methods finally use a dual-faced metallized supporting film, with one face for the connection to the chip and the other face forming the connector. In one improvement, there is designed a metal or dielectric enclosure that surrounds the chip and its connections. This enclosure is filled with protective resin (silicone type thermohardening resin or polyurethane type thermoplastic resin). A micromodule with perfectly reproducible and controlled dimensions and shape is obtained. The protective enclosure filled with resin efficiently protects the chip and its connections from chemical corrosion and mechanical stresses. A micromodule such as this and a corresponding method is described, for example, in the European patent application published under number 0 391 790 filed on Apr. 3, 1990 under number 90 400909.

These micromodules have been developed chiefly for so-called secured applications: disposable or rechargeable prepaid cards, access checking, subscriber cards, bank cards, pay television cards, single service or multiple service cards, etc. For these applications of the micromodules, integrated circuit chips have been specially developed. These chips integrate different protective systems and meet the specifications of a standardized type of connection. In simple memory chips, protective systems are provided in the form of wired logic. Fuses are used to prevent write access to certain zones of the memory. A bearer code for the user of the card may be provided to permit read/write access to the memory zones and to deactivate the chip if a wrong carrier code is presented (in the case of stolen cards). An issuing party code from the organization that delivers the card to the user may be contained in the chip to deactivate it if the code is wrong (in the case of false cards).

In microprocessor-based chips, protection systems of greater sophistication may be used, for example with the implementation of cryptographic algorithms to secure data transfers, the methodical use of bearer and issuing party codes, the possibility of rehabilitating a card (by the releasing of a deactivated chip) etc.

There is a system of software operation that further enables the dynamic management of the memory or the loading of specific programs when the card is customized.

All these secured chips furthermore have security sensors that check the operational conditions of use of the card: whether the frequency of the clock signal CLK is too low or the logic supply voltage Vcc is too high, the presence of the final passivation layer of the chip, etc.

Each of the sensors delivers a binary information element that is used directly to activate a physical security mechanism (deactivation) or is stored to be used by a program for the management of anomalies.

The chip is deactivated, for example, by forcing the level of the resetting signal (RST) to zero or by blocking access to strategic information elements.

The standardized technology of micromodules has therefore led to the development of integrated circuit chips with five to eight outputs that are highly secured in terms of both hardware and software. This has provided for the growth that has been seen in the use of micromodule-based cards.

The development of numerous electronic applications for data processing or telematics requires, as a prerequisite condition, the securing of the ports and of the transfers of data elements. To this end, chip-based readers have been integrated with microcomputers and customized memory-based key readers have been planned in decoders of encrypted systems. In the invention, it is sought to resolve this problem of security, within electronic or computer equipment other than chip cards, on printed circuit cards or silk-screen printed substrates.

One possible idea might have been to use a secured chip developed for micromodules as a standard electronic component by placing it in a standardized package of semiconductors, for example a DIL or SO package.

However, it has been seen that these chips use five to eight outputs. Furthermore, the chips of the most complex micromodules take up a large area. These chips therefore require wide DIL or SO packages with at least 8 to 16 outlets.

Now, the growing complexity of electronic applications requires an increasingly intensive degree of miniaturization especially in fields related to on-board installations or installations in homes or individual premises. It is necessary to propose equipment that is both efficient and compact. Under these conditions, the addition of one or more packages with 8 to 16 outputs on a printed circuit may prove to be difficult for some of these applications.

SUMMARY OF THE INVENTION

To resolve these different problems, the Applicant has thought of making direct use of micromodules as surface-mounted packages to be mounted on interconnection substrates. In this way, the technology used is one that is highly developed as regards security and moreover provides for a high level of integration.

The invention therefore relates to the use of a micromodule as a surface-mounted package on a substrate of interconnections.

The normalized connector of a micromodule is formed by substantially plane zones which are used as contact zones for at least an integrated circuit chip contained in the micromodule. According to the invention, these plane zones are also used for the surface-mounting of the micromodule on a substrate of interconnections.

To implement this invention, another problem has been encountered owing to the nature of the connector of the micromodule.

The connector of a micromodule is formed by substantially plane and fine contact zones adhering to a deformable dielectric surface. A small difference in the level of the contact zones is usual and a slight deformation of the dielectric surface is possible. In practice, the surface of the connection system of the micromodule is not perfectly flat. What is not a problem for micromodule cards for which readers have perfectly suited connectors becomes a major problem when it is necessary to set up reliable contact and conduction between the contact zones of the micromodules and the contact pads on the surface of a printed circuit.

Furthermore, according to the relevant ISO standards, the contact zones have a major surface area in the range 4 to 5 mm$^2$ and two zones of one and the same row are at a distance of 0.2 to 0.84 mm from each other. If it is desired to solder a micromodule to a substrate of interconnections, even by choosing an optimum spacing between the contact zones of the connector of the micromodule, within the framework of what is permitted by the relevant ISO standards, the risk of a short-circuit between the contact zones is very great. For an electrical connection with contact pads on the surface of an interconnection substrate, the useful soldering zone for each contact should be smaller than the surface area of the contact zone so as to prevent short-circuits due to the levels of tolerance in rotation and in terms of X and Y coordinates of the automatic positioning machines. Hence, small contact pads on the substrate are chosen. However, there is also the risk that the soldering might spread naturally throughout the surface of the contact zones of the connector of the micromodule. There is also the risk of short-circuits. To resolve these problems of connection, it is planned, in one embodiment of the invention, to make a barrier to the expansion of solder between at least each useful contact zone of the micromodule and a corresponding contact pad of the substrate of interconnections.

This barrier may be mechanical or physical/chemical. It is preferably conductive. In another embodiment of the invention, it is provided that one end of the contact zones of the micromodule will be free to enable it to be cambered so as to form pins on the rim of the micromodule that are adapted to surface-mounting on a substrate of interconnections.

Another problem has appeared in the lightness and deformability of the surface of the connection system of the micromodule. It is necessary and required that there should be a minimum space between a package and the surface of the printed circuit, in particular to enable the cleaning of the printed circuit and to prevent the formation of aggregates and provide for efficient electrical connection. Now if, for example, a hot air soldering operation is used, pressure has to be applied to the micromodule to keep it in contact with the substrate of interconnections during the addition of hot air from beneath the micromodule. There is then the risk that the micromodule might get deformed or sink excessively, which means a risk of overflow of the solder beyond the set barriers.

In one embodiment of the invention, a mechanical stopping device is then provided between the micromodule and the substrate of interconnections to dictate the thickness of the solder interface. Advantageously, this mechanical stopping device enables the micromodule to be bonded to the substrate before the soldering operation.

In another embodiment of the invention, the pins formed in the extensions of the contact zones of the connector of the micromodule are used both for connection and as a mechanical stopping device.

To obtain the reliability of the routing and positioning of the micromodules by automatic machines, it is preferable to use micromodules having the protective enclosure seen above. This enables high reproducibility of the size of the micromodules and gives this micromodule efficient protection against chemical corrosion and mechanical stresses.

BRIEF DESCRIPTION OF THE DRAWINGS

Other features and advantages of the invention shall be understood more clearly from the following description, made with reference to the appended drawings given by way of a non-restricted example, of which.

DETAILED DESCRIPTION

Figure 1:
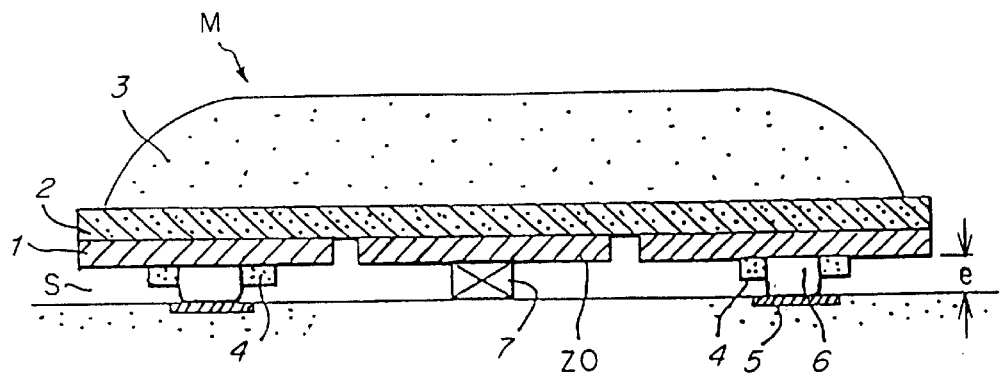
FIGS. 1 to 3 show views in profile of micromodules surface-mounted on a substrate of interconnections according to the invention.
Figure 2:
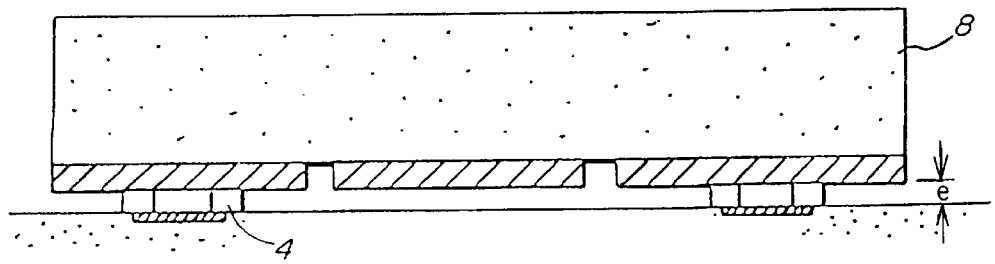
Figure 3:
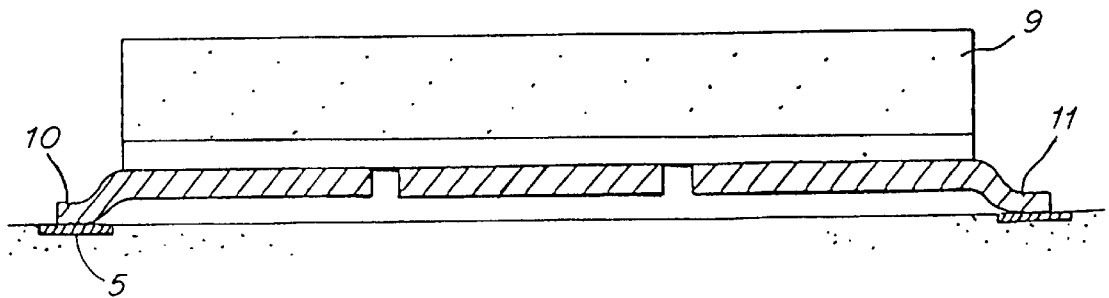

FIGS. 1 to 3 show different shapes of micromodules corresponding to the manufacturing methods already described and mounted on the surface of a substrate of interconnections. The substrate of interconnections may be, for example, a printed circuit, a silk-screen printed substrate or an etched substrate.

FIG. 1 thus shows contact zones 1 of a micromodule M on the surface of a dielectric screen 2. The chip (not shown) is placed in a perforation or a hollow of this dielectric screen 2. The chip is connected to the contact zones by wires that go through perforations of the screen and are soldered to the contact zones. A drop of protection resin 3 coats the chip and its connection wires.

According to one embodiment of the invention, barriers 4 against the expansion of solder are provided between the surface of the connection system formed by the contact zones 1 and the corresponding surface of a silk-screen printed substrate 5.

These are mechanical or physical/chemical barriers. Their thickness is smaller than or equal to the thickness e of the solder interface S.

In the example of FIG. 1, their thickness is smaller than e.

Preferably, these barriers are made on the contact zones of the micromodule. They are, for example, made by tampography or silk-screen printing when they are mechanical or by spraying through a screen when they are physical/chemical. When they are mechanical, it can also be planned to attach them by bonding to the micromodule.

These barriers are preferably conductive. This enables a more appropriate thermal expansion of the entire connection system. But there is no reason why they cannot be insulating.

In the example shown in FIG. 1, the micromodule is further provided with beads 6 of solder in the solid state, deposited within the barriers 4.

In this case, if the barriers are conductive, they are advantageously used as a solder reinforcement after reflow.

Finally, a mechanical stopping device 7 has been planned. In FIG. 1, this device 7 includes a central element placed between the central contact zone Z0 of the micromodule and a corresponding zone of the substrate.

FIG. 2 shows a micromodule that is surface-mounted according to this same method but with barriers 4 having the thickness of the soldered interface S and without any mechanical stopping device.

The micromodule is herein provided with a protective enclosure 8 that surrounds the chip and its connections and is filled with protective resin. In the example shown, this enclosure is a dielectric material formed with the screen by molding.

FIG. 3 shows another micromodule surface-mounted on the surface of a silk-screen printed substrate 5 according to another embodiment of the invention. The micromodule herein has a protective enclosure 9 made of metal. Contact zones are provided with a free end 10 and 11 on the rim of the micromodule. These ends are cambered so that they form surface-mounted package pins. These pins are advantageously used both for the connection to the substrate of interconnections and as mechanical stopping devices.

Figure 4:
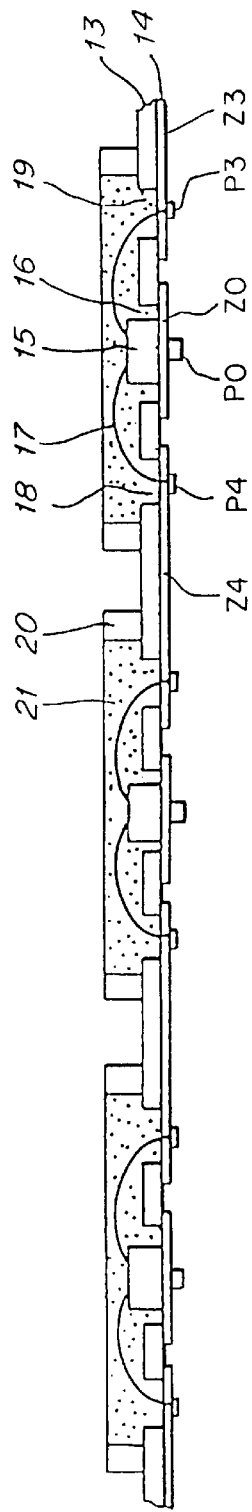
FIG. 4 shows a median cross-sectional view of an exemplary strip of micromodules comprising barriers against the expansion of solder and a mechanical stopping device according to an embodiment of the invention.
Figure 6:
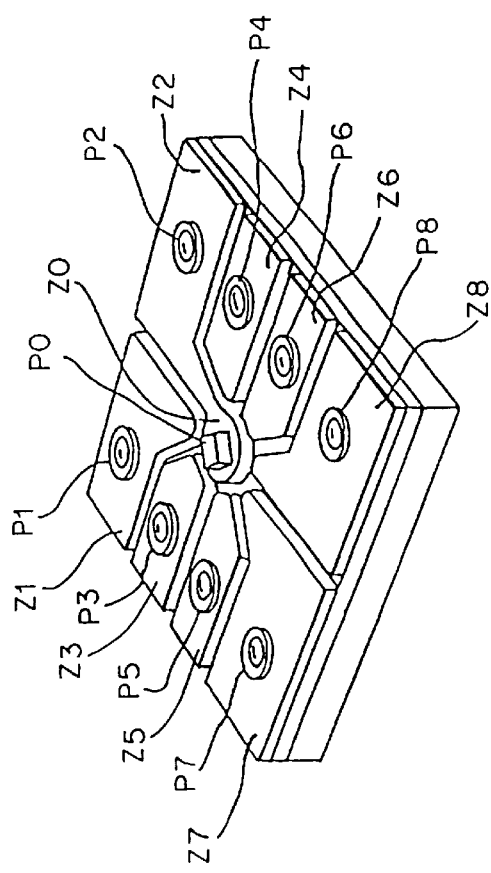
FIGS. 5 and 6 show views in perspective from the top (chip side) and from the bottom (connection side) of a corresponding micromodule.
Figure 5:
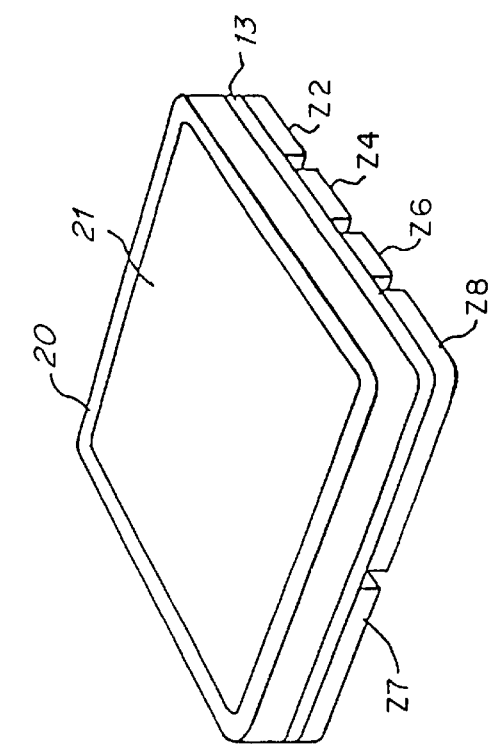

FIGS. 4 to 6 show a micromodule of the type with a metallic protective enclosure on which barriers and a mechanical stopping device have been formed according to the first embodiment of the invention (FIGS. 1 and 2).

FIG. 4 thus shows a strip of micromodules in series as may be obtained according to a method for the continuous molding of a perforated dielectric strip 13 on a grid of metal 14 that bears the pre-sectioned connectors. For each micromodule to be made, a chip 15 is placed in a perforation 16 of the screen on a central zone Z0 of the connector and the connection wires 17 of the chip, brought to contact zones Z3, Z4 of the connector through other perforations 18, 19 of the screen and soldered (this is the tape-automatic bonding or TAB technique).

A protective enclosure 20, made of metal in this case, is molded on the dielectric screen that surrounds the chip 15 and its connections 17. This enclosure is filled with protective resin 21 (FIG. 5).

According to one embodiment of the invention, barriers against the expansion of solder are also made.

It may be recalled that the connector of the micromodule has two rows of three to four contact zones, Z1 to Z8 in FIGS. 4 to 6, with one contact zone Z2 that extends, in the example, into a central part of the surface of the connection system under the chip. This central zone Z0 is not used to set up an external electrical connection of the micromodule with the printed circuit. A barrier to the expansion of solder is made for at least each of the contact zones that have to be electrically connected to corresponding contact pads of the substrate of interconnections. In practice, to simplify the method, these barriers may be made for each of the contact zones of the connector of the micromodule. In the example shown in FIG. 6, the eight contact zones Z1 to Z8 of the connector of the micromodule each have a barrier in the form of an enclosure P1 to P8. These barriers are, for example, mechanical. They may then be made of resin, by silk-screen printing, on the metal grid 14. The resin used will preferably be a synthetic varnish such as the one used to make the solder resist layer of a printed circuit. This is a varnish that withstands soldering temperature, prevents short-circuits between conductors that are close to each other and provides protection against the oxidation of the copper conductors. This varnish is highly resistant with a hard surface and adheres equally well to copper and to the substrate of the printed circuit (for example an epoxy substrate).

It may also be made of a conductive material (metal), which is advantageous in terms of thermal expansion for the connection.

In the example shown in FIGS. 4 to 6, each micromodule also has a mechanical stopping device. In these figures, the mechanical stopping device has a central element referenced P0 and positioned on the central contact zone Z0 which, in the example, is contiguous with the contact zone Z2. The mechanical stopping device may also include at least three elements P01, P02, P03 defining a plane, as shown in FIG. 7.

The elements of the mechanical stopping device have a thickness in the range of the determined thickness e of the solder interface.

They may be made of insulating or conductive material. For example, they may be made of resin, by tampography, silk-screen printing or bonding. Finally, these elements of the mechanical stopping device can be made either on the surface of the connection system of the micromodule or else on the surface of the substrate of interconnections.

Figure 7:
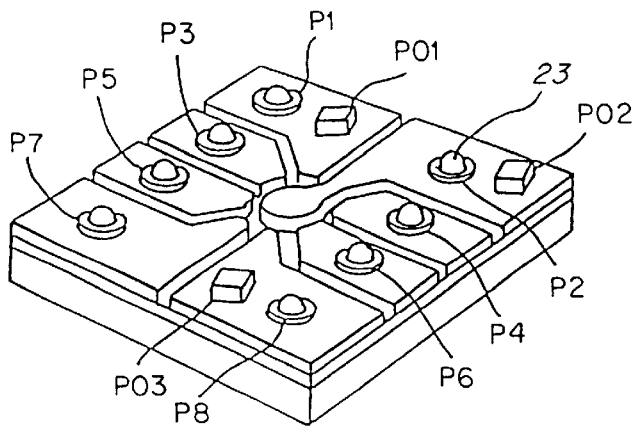
FIG. 7 shows a sectional view of the connection of a contact zone of a micromodule to a contact pad of a substrate of interconnections according to the first embodiment.

In one variant shown in FIG. 7, it is provided, in the manufacture of the strip of micromodules, for depositing a bead or ball 23 of solder compound in the solid state, for example a solid tin/lead bead in each of the interposed chambers P1 to P8 calibrated for the volume of the enclosure. This approach is especially favorable for the accurate positioning of the micromodule on the printed circuit (with a concentration of energy at the tip of the molten bead which helps promote the mechanical self-alignment of the micromodule with the printed circuit). The strip of micromodules obtained according to this first method of the invention may therefore take on a different appearance depending on whether balls of solder or mechanical stopping device elements are planned. It may be used directly by an automatic positioning machine that provides for the partitioning of each micromodule.

The strip of micromodules may also be partitioned and the individual micromodules obtained placed in alveolar strips or in tubes which are the usual supply cartridges used in automatic positioning machines.

The micromodules obtained are adapted to reflow soldering on contact pads of the substrate of interconnections.

For the hot air soldering or vapor phase soldering, the operation is performed by silk-screen printing or by the transfer of solder compound that is sufficiently sticky to further enable the positioning of the micromodules. It is also possible to provide for adhesive on the mechanical stopping device, thus enabling the micromodule to be held in position during the soldering operation.

Figure 8:
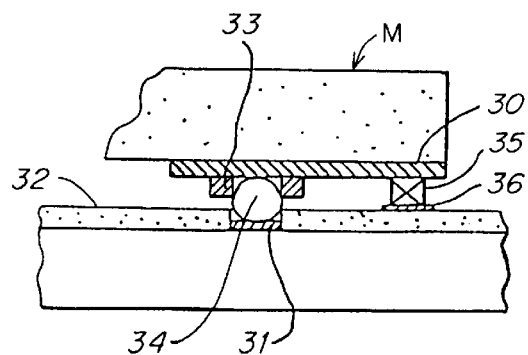
FIG. 8 shows a variant of FIG. 7 with beads of solder in the solid state.

FIG. 8 shows a sectional view of a connection of a contact zone 30 of a micromodule M according to the invention on a contact pad 31 of a substrate of interconnections for hot air soldering.

In the example, the tin-plated contact pad 31 is demarcated by a layer of solder resist varnish 32.

A barrier 33 made according to the invention on the contact zone 30 contains a calibrated ball of solder 34 (tin/lead for example).

A mechanical stopping device 35 according to the invention is made on this contact zone 30 and bonded (36) to the substrate.

A pressure P may then be applied to the micromodule and the addition of hot air may cause the ball 34 to remelt locally. The ball 34 gets crushed on the contact pad 31. This crushing is controlled by the mechanical stopping device 35 which maintains the thickness of the solder interface.

It has been seen that, in practice, the eight contact zones of a connector of the micromodule are not always used. In particular, for the microprocessor chips, only six contact zones are used for the electrical interface. In certain cases, micromodule connectors with six contact zones may then be made. The bank card is an example of this. Or else, connectors with eight contact zones are used, with two contact zones that are unused, having no electrical role assigned to them.

The invention can be applied of course to these different variants. In particular, it is possible to provide for the making of the mechanical stopping devices on the unused contact zones. It is also possible to connect these unused contact zones to corresponding pads of the substrate of interconnections, according to the method of the invention.

The use of barriers to demarcate the expansion of the solder and hence to demarcate the connection zone between the micromodule and the substrate of inteconnections, or the use of pins, eliminates the risks of short-circuit related to the tolerances of positioning in terms of X, Y coordinates and of the rotation of the automatic positioning machines.

Preferably, in the embodiment using barriers, it is provided that the connection zone for a contact zone of the micromodule, demarcated by an interposed enclosure, will not exceed about 1 mm$^2$. It is then possible to choose an optimum spacing between the contact zones of the connector of the micromodule, within the framework of what is permitted by the ISO standards, so as not to contribute to the creation of short-circuits.

Finally, the barriers and stopping devices may have any shape. In the example shown, the enclosures are annular and the stopping devices are cube-shaped.

Figure 9:
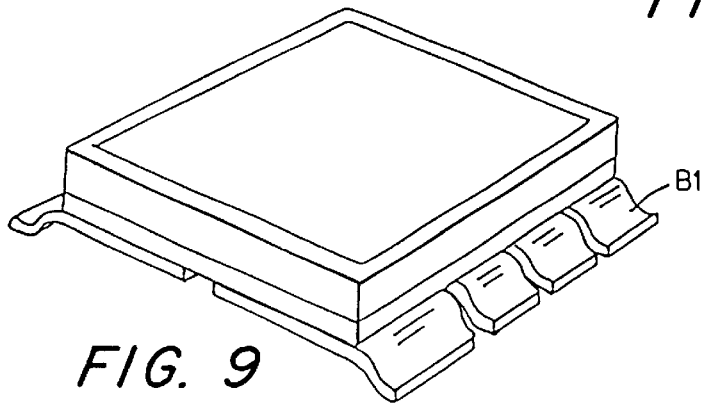
FIGS. 9 and 10 are views in perspective from the top (chip side) and from the bottom (connection side) of a micromodule according to another embodiment of the invention.
Figure 10:
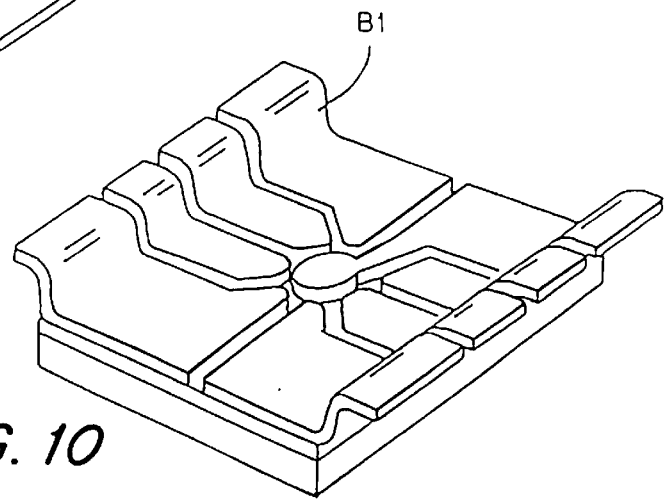

Another embodiment of the invention is shown in FIGS. 9 and 10. In this embodiment, the contact zones of the connector of a micromodule are converted into surface-mounted pins. Thus, according to the invention, it is planned, in this case, that the contact zones will be provided with free ends that go beyond the rim of the micromodule. In the example, it is planned that the strip of micromodules seen in FIG. 4, comprising a strip of dielectric screen molded on the metal grid forming the contact zones, will be exposed to light to form an aperture in the dielectric screen so as to enable the partitioning of the strip in these apertures. Individual micromodules are obtained with free ends of metal on their rim. These ends are the tongues that held the pre-sectioned contact zones of the connector at the grid 13 of the manufacturing strip. A cambering operation then shapes the pins B1 for the surface-mounting of the micromodules by electrical soldering. The different shapes of surface-mounting pins may be obtained by this method which is not limited to the shape given by way of an example in FIGS. 9 and 10. The pins thus formed are then advantageously used both for connection and as mechanical stopping devices.

In the case of these micromodules with surface-mounting pins according to the second embodiment of the invention and as seen with reference to FIGS. 9 and 10, it is possible to provide for several pins per contact zone. It is enough for a pre-sectioned contact zone to be attached to the supporting metal grid by several tongues. The partitioning is done far from the contact zones so as to keep these tongues as free ends for each contact zone. These tongues can then be cambered. The partitioning and cambering operation may be done by the automatic positioning machine comprising appropriate tools.

The different embodiments and variants described enable the surface-mounting of micromodules to be done reliably and on an industrial scale. The deformability and lightness of the micromodule are judiciously compensated for by the mechanical stopping devices which may be obtained by simple silk-screen printing or by pins. These low-cost operations of adaptation also make it possible to limit the risks of short-circuiting related to the shape of the contact zones of the micromodule.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A micromodule for being mounted on a substrate that includes a plurality of surface mount pads, the micromodule comprising:

a chip card connector constructed and arranged in accordance with chip card technology, the chip card connector including a flat conductive strip partitioned into a central region and no more than eight contact zones disposed about the central region, the chip card connector having a first face and a second face opposite the first face;

a plurality of cambered tongues extending from the periphery of the chip card connector and below the first face of the chip card connector to be soldered to the surface mount pads, each cambered tongue being integrally formed with a corresponding contact zone as a unitary structure; and at least one chip card integrated circuit chip mounted to the second face of the chip card connector in the central region thereof and electrically connected to at least one of the contact zones.

2. The micromodule according to claim 1, further comprising a perforated dielectric screen attached to the second face of the chip card connector, the integrated circuit chip being disposed in a perforation of the dielectric screen.

3. The micromodule according to claim 2, further comprising protective resin disposed on the dielectric screen and the second face of the chip card connector to encapsulate the integrated circuit chip.

4. An apparatus comprising:

a substrate including a plurality of surface mount pads; and a chip card micromodule mounted to the substrate and soldered directly to the surface mount pads, the micromodule including:

a chip card connector constructed and arranged in accordance with chip card technology, the chip card connector including a flat conductive strip partitioned into no more than eight contact zones that are soldered to the surface mount pads of the substrate, the chip card connector having opposing first and second faces; and at least one chip card integrated circuit chip mounted to the second face of the chip card connector, the chip being electrically connected to at least one of the contact zones.

5. The apparatus according to claim 4, wherein the chip card micromodule has a thickness less than approximately 0.6 mm.

6. The apparatus according to claim 4, wherein the chip card micromodule further includes a protective resin encapsulating the chip card integrated circuit chip.

* * * * *